United States Patent [19]

Ikeda et al.

[11] Patent Number: 5,762,672
[45] Date of Patent: Jun. 9, 1998

[54] METHOD FOR PRODUCING A QUARTZ GLASS CRUCIBLE

[75] Inventors: Tooru Ikeda, Vancouver, Wash.; Kazuo Asajima, Nanjo-gun, Japan; Hiroshi Kimura, Fukui, Japan; Hiroyuki Watanabe, Takefu, Japan

[73] Assignees: Shin-Etsu Quartz Products, Ltd., Tokyo, Japan; Heraeus Quarzglas GmbH, Hanau, Germany

[21] Appl. No.: 500,541

[22] Filed: Jul. 11, 1995

[30] Foreign Application Priority Data

Jul. 19, 1994 [JP] Japan ............ 6-187905

[51] Int. Cl.$^6$ ............................................. C03B 19/04
[52] U.S. Cl. .................. 65/17.3; 65/71; 65/81; 65/144; 65/302; 65/DIG. 8
[58] Field of Search ................ 65/17.3, 17.4, 65/68, 71, 81, 33.1, 144, 302, 361, DIG. 8, 266, 263

[56] References Cited

U.S. PATENT DOCUMENTS

| | | | |
|---|---|---|---|
| 4,416,680 | 11/1983 | Bruning et al. | 65/17.3 |
| 4,528,163 | 7/1985 | Albrecht | 65/17.3 |
| 4,632,686 | 12/1986 | Brown et al. | 65/17.3 |
| 4,713,104 | 12/1987 | Brown et al. | 65/17.3 |
| 4,759,787 | 7/1988 | Winterburn | 65/30.1 |
| 4,935,046 | 6/1990 | Uchikawa et al. | 65/18.2 |
| 4,956,208 | 9/1990 | Uchikawa et al. | 65/17.3 |
| 4,963,178 | 10/1990 | Brown et al. | 65/17.3 |
| 5,174,801 | 12/1992 | Matsumura et al. | 65/17.3 |

FOREIGN PATENT DOCUMENTS

| | | | |
|---|---|---|---|
| 59-164645 | 9/1984 | Japan . | |
| 1-157427 | 6/1989 | Japan | 65/71 |

OTHER PUBLICATIONS

R. Bruckner, "Silicon Dioxide", Encyclopedia of Applied Physics, vol. 18, pp. 101, 112–114, 130–131, 1997.

Primary Examiner—Steven P. Griffin
Attorney, Agent, or Firm—Felfe & Lynch

[57] ABSTRACT

In a quartz glass crucible obtained by heating and fusing a rotating layer (3) charged with a powder of silicon dioxide, impurity elements are controlled so that copper, chromium, and nickel each amount to 0.5 ppb or less, iron amounts to 120 ppb or less, and sodium amounts to 20 ppb or less. The silicon dioxide powder is supplied to a rotatable mold (1) having an open top, thereby forming a layer (3) charged with silicon dioxide along the inner peripheral wall of the mold. The layer (3) is internally heated and fused while covering the open top with a lid (5) having two or more holes (6,7), and the mold (1) is ventilated to discharge the high temperature gases through the holes (6,7).

5 Claims, 3 Drawing Sheets

METHOD FOR PRODUCING A QUARTZ GLASS CRUCIBLE

INDUSTRIAL FIELD OF APPLICATION

The present invention relates to a quartz glass crucible made entirely of high purity quartz glass, and particularly to a quartz glass crucible having an inner surface layer which is made of a quartz glass that is not only of high purity, but also free of aggregates of fine bubbles (sometimes referred to simply hereinafter as "fine-bubble aggregates"). The present invention also relates to a method for producing the quartz glass crucible above, and to an apparatus for effecting the method.

PRIOR ART

Single crystal silicon for use as a single crystal semiconductor substrate has been fabricated heretofore by a so-called Czochralski method which comprises fusing polycrystalline silicon inside a quartz glass crucible, and then allowing crystal growth to occur by using a seed crystal. There are several types of quartz glass crucibles for use in the fabrication method above depending on the method of producing the crucible, however, practically useful is a semi-transparent quartz glass crucible. The semi-transparent quartz glass crucible is fabricated by charging a powder of silicon dioxide along the peripheral internal wall of a rotatable hollow mold, and then heating and fusing the powder of silicon dioxide while rotating the mold. Because a plurality of bubbles are dispersed in the glass, the semi-transparent quartz glass crucible is more advantageous than other crucibles in that it realizes a uniform thermal distribution and that it yields a higher strength as to enable a crucible of a desired size.

In case of growing a single crystal silicon by using the semi-transparent quartz glass crucible above, the crystallization has been found to become unstable during the process, resulting in a low degree of crystallization (the ratio of generating single crystals from polycrystalline silicon). Mentioned as a reason for this problem is that the sublimable component of silicon dioxide used as the starting material condenses and drops to form an aggregate of fine bubbles, and that the aggregate of fine bubbles undergoes thermal expansion as to partially suffer peeling off from the peripheral internal wall. The small fraction of quartz which falls off from the peripheral internal wall is mixed into fused silicon. As a means for overcoming this problem, methods for producing quartz glass crucible have been proposed, for instance, a method comprising heating and fusing the internal surface of the crucible to form a transparent layer, or a method comprising forming a thick transparent layer by scattering a fused powder of silicon dioxide. However, none of the methods proposed heretofore can sufficiently remove the aggregate of fine bubbles, and hence, no quartz glass crucible capable of realizing a pulled up single crystal silicon with high crystallization ratio is made available. Moreover, the aforementioned step of heating and fusing causes contamination of the inner surface of the crucible, due to, for instance, the selective evaporation and condensation of silicon dioxide and the impurities that are present in silicon dioxide in a trace quantity, or the scattering of ash content which occurs with the wear of graphite used as the electrode. Thus, although a high purity starting material has been used, it is found impossible to obtain an inner surface corresponding to the high purity starting material. Accordingly, even if a high purity starting material is used, the effect of suppressing the crystal defects is found insufficient.

SUMMARY OF THE INVENTION

In the light of the aforementioned circumstances, the present inventors continuously performed an extensive study. As a result, it has been found that the above problems can be overcome by ventilating the mold to discharge the high temperature gaseous atmosphere containing the sublimable silicon dioxide component and the condensed impurities. The present invention has been accomplished based on these findings.

Accordingly, an object of the present invention is to provide a high purity quartz glass crucible.

Another object of the present invention is to provide a high purity quartz glass crucible which is also free from aggregates of fine bubbles in the inner surface layer.

A yet other object of the present invention is to provide an industrially advantageous method for producing the quartz glass crucible above.

A still other object of the present invention is to provide an apparatus for performing the method for producing the quartz glass crucible above.

MEANS FOR SOLVING THE PROBLEMS

The aforementioned objects can be accomplished by the present invention, which comprises a quartz glass crucible obtained by heating and fusing a rotating layer charged with a powder of silicon dioxide, provided that the impurity elements contained in said quartz glass crucible being controlled as such that copper, chromium, and nickel each amount for 0.5 ppb or less, that iron amount for 120 ppb or less, and that sodium amount for 20 ppb or less; a method for producing a quartz glass crucible characterized in that it comprises supplying a powder of silicon dioxide to a rotatable mold having an open portion on the top thereof, thereby forming a layer charged with silicon dioxide along the inner peripheral wall of the mold, and internally heating and fusing the layer, provided that heating and fusing is effected while covering the opening portion of the mold with a lid having 2 or more holes, and ventilating the mold to discharge the high temperature gaseous atmosphere through the holes; and an apparatus for use in the method for producing the quartz glass crucible above.

The quartz glass crucible according to the present invention is a semi-transparent quartz glass crucible which stably allows single crystal silicon to grow therein, and which contains, as impurities, copper, chromium, and nickel each at an amount of 0.5 ppb or less, iron at 120 ppb or less, and sodium at 20 ppb or less. In particular, the high purity quartz glass crucible comprising a transparent layer on the inner surface thereof to a depth of 1 mm or less, with said transparent layer containing not more than one aggregate of fine bubbles having a diameter exceeding 2 mm.

The quartz glass crucible according to the present invention is produced by using a powder of silicon dioxide such as a high purity crystalline silicon dioxide powder or a high purity powder of amorphous silicon dioxide synthesized by sol-gel process. The powder is supplied inside a rotatable mold through the opening provided to the top thereof to form a layer charged with the powder of silicon dioxide along the peripheral inner wall of the mold, and the layer charged with the powder of silicon dioxide is internally heated and fused while ventilating the mold to drive out the high-temperature gaseous atmosphere. In particular, a quartz glass crucible having a transparent layer is produced by (i) heating and fusing the layer charged with silicon dioxide powder, while reducing the pressure inside the mold having an opening on the top thereof by providing ventilation holes on the mold to make the mold gas-permeable; and (ii) as described in JP-A-2-188489 (the term "JP-A-" as referred herein signifies an "unexamined published Japanese patent application") and the like, forming a layer charged with silicon dioxide powder inside a rotating mold having an upper opening on the top thereof, and, while internally heating and fusing the layer charged with silicon dioxide powder to provide the base layer and ventilating the mold to drive out the high temperature gaseous atmosphere, supplying and scattering the powder of silicon dioxide in small portions. The gas flow to be used in the method for producing the mold above contains dust at a density of 0.01 mg/m3 or less. If the gas flow contains dust at a density greater than the range above, the particles incorporated inside the crucible as impurity induce the formation of fine bubbles on the surface of the crucible, or contamination of crucible occurs.

The ventilation during the production of the quartz glass crucible is effected through a hole provided to the lid covering the upper opening provided to the top of the mold, however, two or more holes which are provided to effect both evacuation and gas supply, are provided at a number as such that the high temperature gaseous atmosphere may not be destroyed. The holes are preferably provided independent to each other, and the shape thereof is circular, oval, or rectangular. A slit-like hole is not preferred from the viewpoint of its weak effect on ventilation. While the high temperature gaseous atmosphere containing the sublimable component of silicon dioxide and the impurities condensed by the repeated sublimation and condensation is discharged through one of the holes above, a replenishing gas flow is supplied through the other hole. The ventilation can be effected either naturally or forcibly, but preferred is to employ forced ventilation. To perform forced ventilation, a ventilation duct is provided either on the upper portion of the discharge hole, or ventilation ducts are each provided on the upper portion of both the discharge hole and the gas supply hole. The end of the gas supply duct provided for gas supply may be further connected to a dust filter to prevent outer impurity particles from being mixed into the gas. Even if the atmosphere inside the room for producing the crucible contains dust at a concentration exceeding 0.01 mg/m³, the dust concentration of the atmosphere inside the mold can be maintained at a level of 0.01 mg/m³ or lower.

DETAILED DESCRIPTION OF THE PREFERRED EMBODIMENT

Figure 1:
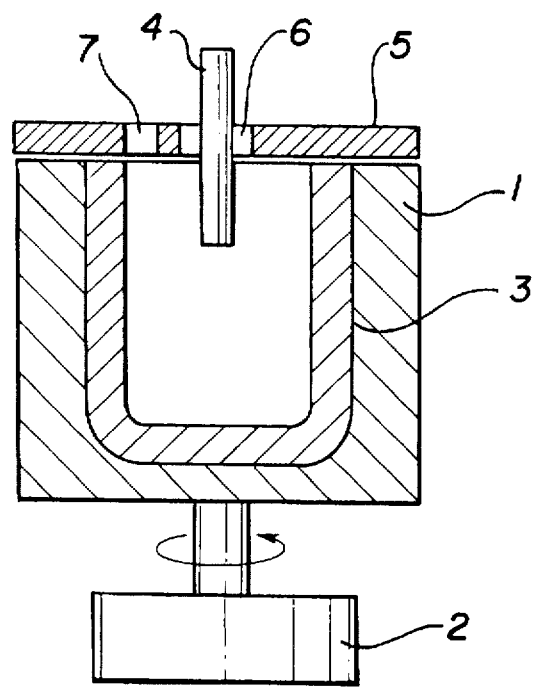
FIG. 1 shows the perpendicular cross sectional view of an apparatus including a mold having a lid with two or more holes for use in producing a quartz glass crucible.
Figure 2:
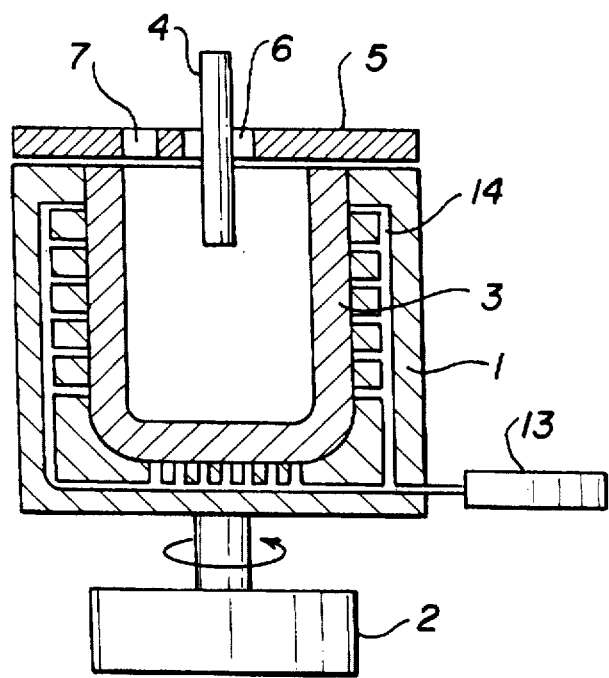
FIG. 2 shows the perpendicular cross sectional view of an apparatus for use in producing a quartz glass crucible according to a preferred example of the present invention.
Figure 3:
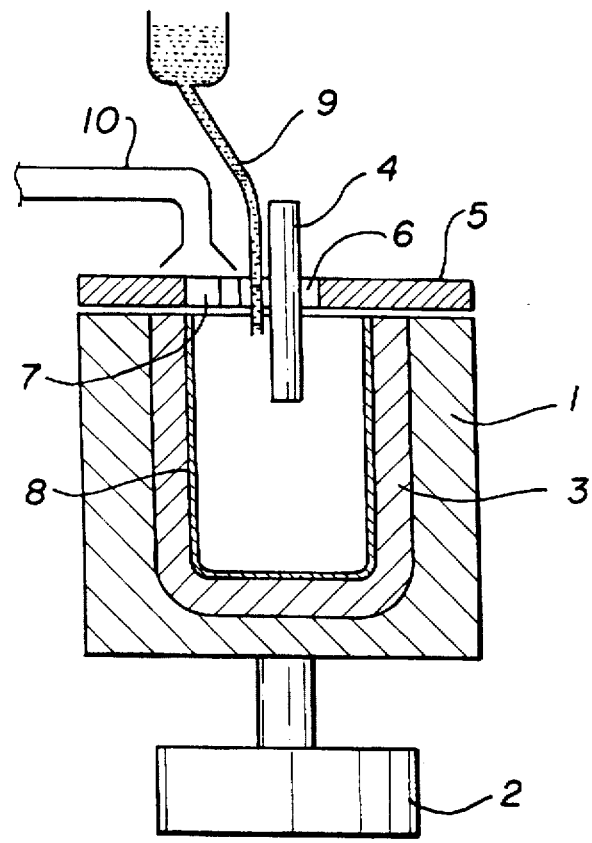
FIG. 3 shows the perpendicular cross sectional view of an apparatus for use in producing a quartz glass crucible according to another preferred example of the present invention.

The apparatus for use in the production method according to the present invention is described below. Referring to FIG. 1, the apparatus for use in producing a quartz glass crucible according to the present invention comprises a mold I having an opening on the top thereof, a lid 5 which covers the opening of the mold and which comprises two or more holes 6 and 7, a heating element 4 inserted inside the mold through one of the holes, and a rotation drive mechanism 2. Referring to FIG. 2, a ventilation hole 14 is provided to the mold 1 to render the mold gas-permeable, and a vacuum device 13 is provided to the outer periphery to suction the gas inside the mold via conduit 14 and thereby reduce the pressure during heating and fusing the layer 3 charged with silicon dioxide powder. Thus is obtained a transparent layer on the inner surface of the mold. Otherwise, referring to FIG. 3, a heating element and a duct 9 for supplying a powder for supplying silicon dioxide are inserted into a first hole 6 by taking a spacing therebetween to heat and fuse the layer 3 charged with silicon dioxide powder while additionally supplying a powder of silicon dioxide, so that the additionally supplied powder may be fused and scattered to form a transparent layer 8. By using this apparatus, a quartz glass crucible having a smooth inner surface can be produced, said quartz glass crucible having a transparent layer 8 free of aggregates of fine bubbles and provided over a depth of 1 mm or less from the inner surface of the crucible. Furthermore, by providing a discharge duct 10 on the upper side of the discharge hole of the apparatuses as illustrated in FIG. 3, forced ventilation can be effected to increase the purity of and to decrease the number of fine bubble aggregates in the inner surface layer of the crucible.

Figure 4:
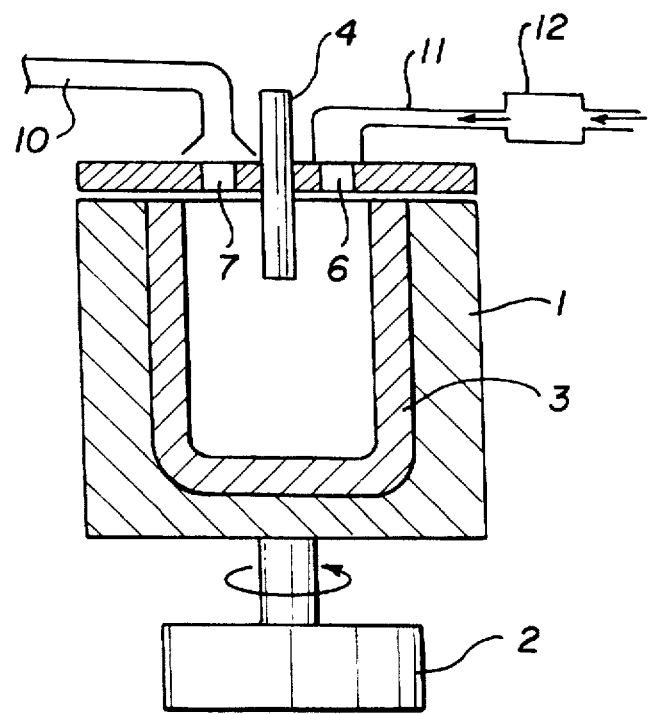
FIG. 4 shows the perpendicular cross sectional view of the apparatus for use in producing a quartz glass crucible as shown in FIG. 1, except that a gas discharge duct and a gas supply duct are provided.

By furthermore providing both of a discharge duct 10 and a gas-supply duct 11 as shown in FIG. 4, the ventilation of the mold can be effected forcibly to drive out the high temperature gaseous atmosphere from the mold. In this manner, the formation of the aggregates of fine bubbles as well as contamination can be greatly reduced. By connecting a dust filter 12 to the end of the gas-supply duct 11, impurity particles can be prevented from being mixed in the crucible.

The present invention is described in further detail referring to the Examples below. However, the present invention is not only limited thereto.

EXAMPLE 1

Referring to an apparatus shown in FIG. 1, 12 kg of silicon dioxide powder consisting of particles from 150 to 300 μm in diameter was supplied inside a rotating mold 1 through a first hole 6 to form a layer 3 charged with silicon dioxide powder along the inner peripheral wall of the mold, and while rotating the mold, the layer charged with silicon dioxide powder was internally heated and fused. At the same time, furthermore, the mold was ventilated by discharging a high temperature gaseous atmosphere inside the mold through a second hole 7 while supplying a gas flow through a first hole 6. Thus were produced ten semi-transparent quartz glass crucibles each 460 mm in diameter. The quartz glass crucibles thus obtained were visually inspected to count the population of fine-bubble aggregates having a diameter larger than 2 mm.

Each of the quartz glass crucible thus obtained above was used in pulling up a 6-inch (152.4-mm) boron-doped single crystal silicon. The presence of dislocations was inspected every time pulling up was performed. The results are given in Table 2.

COMPARATIVE EXAMPLE 1

Figure 5:
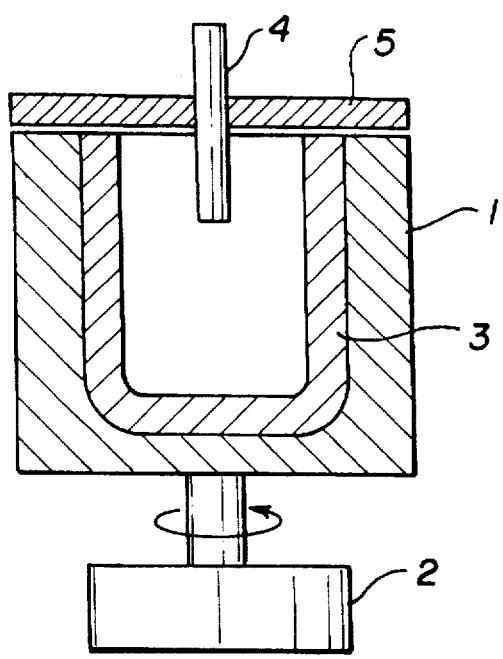
FIG. 5 shows the perpendicular cross sectional view of the apparatus for use in producing a quartz glass crucible as shown in FIG. 1.

Ten quartz glass crucibles were produced using the same starting material as that used in Example 1 and by an operation similar to that described in Example 1, except for using an apparatus having no holes in the lid as shown in FIG. 5. Each of the quartz glass crucibles thus obtained was subjected to the same inspections as those performed in Example 1. The results are given in Tables 1 and 2.

TABLE 1

| Number of Fine-bubble Aggregates Larger than 2 mm in Diameter (per one crucible) | Samples Obtained in Example 1 | Samples Obtained in Comparative Ex. 1 |
|---|---|---|
| 2 or more | 0 | 0 |
| 1 | 0 | 0 |
| 0 | 10 | 1 |
| Total | 10 | 10 |

TABLE 2

| Times of Pulling up Single Crystals | Batches with Dislocation/Total Batches | |
|---|---|---|
| | Samples of Example 1 | Samples of Comp. Ex. 1 |
| 1 | 0/10 | 0/10 |
| 2 | 0/10 | 2/10 |
| 3 | 1/10 | 2/8 |
| 4 | 1/9 | 4/6 |
| 5 | 1/8 | 2/2 |

As is clearly read from Tables 1 and 2, very few fine-bubble aggregates are found to form in the quartz glass crucible obtained according to the present invention. Little trouble was found even after pulling up single crystal silicon for five times using the quartz glass crucible according to the present invention, and yet, a favorable crystallization ratio for single crystals was obtained.

EXAMPLE 2

Referring to an apparatus shown in FIG. 3, 12 kg of silicon dioxide powder consisting of particles from 150 to 300 μm in diameter was supplied inside a rotating mold 1 to form first a layer 3 charged with silicon dioxide powder along the inner peripheral wall of the mold, and while rotating the mold, the layer charged with silicon dioxide powder was internally heated using a heating carbon electrode to obtain the base layer. At the same time, 1.2 kg of silicon dioxide powder composed of particles having the same particle diameter as that of the powder above was supplied at a rate of 120 g/min to allow it fuse and scatter on the base to form a 0.8 mm thick transparent second layer. Thus were obtained 10 semi-transparent quartz glass crucibles each 460 mm in diameter. While supplying the silicon dioxide powder above, evacuation was effected at a rate of 14 m³/min through the second hole 7 in the lid 5 via a gas discharge duct. The atmosphere inside the production chamber contained dust at a concentration of 0.005 mg/m³. The dust concentration was measured by using a low volume air sampler equipped with a filter having an aperture of 0.8 μm.

The quartz glass crucibles each having a transparent layer thus obtained were visually inspected to count the population of fine-bubble aggregates having a diameter larger than 2 mm. The results are given in Table 3.

Five quartz glass crucibles were randomly selected from the ten quartz glass crucibles above, and samples were cut out from each of the transparent layer and the base layer. The impurity content in each of the layers was measured by means of high frequency induction coupled plasma mass spectroscopy and atomic absorption spectroscopy. The results are given in Table 4.

For comparison, on the other hand, ten quartz glass crucibles each 460 mm in diameter and having a transparent layer were produced by using an apparatus as shown in FIG. 2, except for using a lid having no holes. Similar tests as those described above were performed on the quartz glass crucibles thus obtained, and the results are given in Tables 3 and 4.

TABLE 3

| Number of Fine-bubble Aggregates Larger than 2 mm in Diameter (per one crucible) | Samples Obtained in Example 2 | Samples Obtained in Comparative Ex. |
|---|---|---|
| 2 or more | 0 | 8 |
| 1 | 1 | 2 |
| 0 | 9 | 0 |
| Total | 10 | 10 |

TABLE 4

| | Impurity Concentration | | | | |
|---|---|---|---|---|---|
| | Starting Material | Samples of Ex. 2 | | Samples of Comp. Ex. | |
| | | Transparent | Base | Transparent | Base |
| Na | <10 ppb | <10 ppb | <10 ppb | 20 ppb | 10 ppb |
| K | 110 ppb | 110 ppb | 110 ppb | 130 ppb | 110 ppb |
| Li | 730 ppb | 680 ppb | 730 ppb | 680 ppb | 730 ppb |
| Ca | 350 ppb | 350 ppb | 350 ppb | 480 ppb | 350 ppb |
| Mg | 30 ppb | 30 ppb | 30 ppb | 30 ppb | 30 ppb |
| Al | 15 ppm | 15 ppm | 15 ppm | 15 ppm | 15 ppm |
| Fe | 60 ppb | 60 ppb | 60 ppb | 130 ppb | 60 ppb |
| Cu | <0.3 ppb | <0.3 ppb | <0.3 ppb | 1 ppb | 0.7 ppb |
| Cr | <0.5 ppb | <0.5 ppb | <0.5 ppb | 5 ppb | <0.5 ppb |
| Ni | <0.3 ppb | <0.3 ppb | <0.3 ppb | 3 ppb | <0.3 ppb |

From Tables 3 and 4 above, it can be seen that the quartz glass crucibles according to the present invention contain impurities in both the transparent layer and the base layer at a concentration corresponding to that of the starting material. Moreover, only one fine-bubble aggregate was found. However, impurities were found to concentrate in the transparent layer of the comparative, examples, and a large number of fine-bubble aggregates were observed.

EXAMPLE 3

Each of the remaining five samples of the ten quartz glass crucibles prepared in Example 2 was used in pulling up a 6-inch (152.4-mm) phosphorus-doped single crystal silicon. The presence of dislocations was inspected every time pulling up was performed. The results are given in Table 5. Furthermore, the number of oxidation-induced stacking defects per unit area in the central portion was obtained on the single crystal silicon obtained at the third time of pulling up as given in Table 5 and the average value was calculated. The results are given in Table 6.

On the other hand, the rest of the ten quartz glass crucibles prepared as comparative examples in Example 2, i.e., five quartz glass crucibles, were subjected to tests similar to those performed above. The results are given in Tables 5 and 6.

TABLE 5

| Times of Pulling up Single Crystals | Batches with Dislocation/Total Batches | |
|---|---|---|
| | Samples of Example 2 | Samples of Comp. Ex. |
| 1 | 0/5 | 0/5 |
| 2 | 0/5 | 0/5 |
| 3 | 0/5 | 1/5 |
| 4 | 1/5 | 2/4 |
| 5 | 0/4 | 2/2 |
| 6 | 1/4 | No pulling up |

TABLE 6

| | Number of Oxidation-Induced Stacking Defects |
|---|---|
| Av. of 5 single crystal silicon obtained by pulling up in quartz glass crucible according to the present invention | 4 |
| Av. of 5 single crystal silicon obtained by pulling up in quartz glass crucible of comparative example | 56 |

Tables 5 and 6 clearly read that, by using the quartz glass crucibles according to the present invention, single crystal silicon can be obtained stably for a plurality of times, and yet, at a high crystallization ratio. Furthermore, the quartz glass crucibles according to the present invention enable a high quality single crystal silicon.

EFFECT OF THE INVENTION

The quartz glass crucibles according to the present invention contain no fine-bubble aggregates formed in the inner surface layer, and are free of impurity contamination attributed to alkali metal elements, calcium, and transition metal elements such as iron. Thus, pulling up of single crystal silicon can be effected stably and with high crystallization ratio. Thus, single crystals can be obtained at improved productivity and with high quality. The quartz glass crucible above can be produced by a simple process which comprises supplying a powder of silicon dioxide into a rotating mold to form a layer charged with silicon dioxide powder, and discharging the high temperature gaseous atmosphere containing the sublimable component of silicon dioxide and impurities out of the mold through the holes provided in the lid covering the mold at the same time of heating and fusing the layer charged with silicon dioxide powder. Furthermore, the apparatus for use in implementing the above method of production is industrially advantageous, because it can be obtained by simply perforating two or more holes in the lid covering the upper opening portion provided to the top of the mold used in a conventional apparatus for producing quartz glass crucibles.

We claim:

1. Method for producing a quartz glass crucible, said method comprising the following steps:

providing a rotatable mold having an inner peripheral wall and an open top, forming a first layer of silicon dioxide powder on the inner peripheral wall, covering the open top with a lid having hole means therein, rotating said mold with said layer of silicon dioxide powder on the inner peripheral wall, internally heating and fusing said first layer while said lid covers said open top, and forcibly ventilating said mold via said hole means while internally heating and fusing said layer, said ventilating being performed by introducing a gas into said crucible via said hole means.

2. Method as in claim 1 further comprising providing means for applying suction to said inner peripheral wall, and applying suction to said inner peripheral wall while internally heating and fusing said layer.

3. Method as in claim 1 further comprising supplying additional silicon dioxide powder to said mold while internally heating and fusing said first layer, said powder being supplied gradually so that it will melt and scatter while said mold is rotating, thereby forming a transparent second layer on said first layer.

4. Method as in claim 1 wherein said ventilating is performed by introducing into said mold a gas having a dust concentration of less than 0.01 mg/m$^3$.

5. Method for producing a quartz glass crucible, said method comprising providing a rotatable mold having an inner peripheral wall and an open top, forming a first layer of silicon dioxide powder on the inner peripheral wall, covering the open top with a lid having hole means therein, rotating said mold with said layer of silicon dioxide powder on the inner peripheral wall, internally heating and fusing said first layer while said lid covers said open top, and ventilating said mold via said hole means while internally heating and fusing said layer, said ventilating being performed by introducing into said mold a gas having a dust concentration of less than 0.01 mg/m$^3$.

* * * * *